(12) United States Patent
Miyagawa et al.

(10) Patent No.: US 7,175,971 B2
(45) Date of Patent: Feb. 13, 2007

(54) EXPOSURE PROCESSING METHOD OF A PLANOGRAPHIC PRINTING PLATE AND APPARATUS FOR EXECUTING THE SAME METHOD

(75) Inventors: Ichirou Miyagawa, Kanagawa (JP); Akinori Kimura, Kanagawa (JP); Toshifumi Inno, Shizuoka-ken (JP); Gaku Kumada, Shizuoka-ken (JP)

(73) Assignee: Fuji Photo Film Co. Ltd., Kanagawa (JP)

( * ) Notice: Subject to any disclaimer, the term of this patent is extended or adjusted under 35 U.S.C. 154(b) by 35 days.

(21) Appl. No.: 11/091,340

(22) Filed: Mar. 29, 2005

(65) Prior Publication Data

US 2005/0227179 A1    Oct. 13, 2005

(30) Foreign Application Priority Data

Mar. 29, 2004    (JP)    ............................. 2004-096747

(51) Int. Cl.
*G03F 7/26* (2006.01)
(52) U.S. Cl. ................... 430/302; 430/138; 430/281.1; 430/286.1; 430/309; 430/348; 430/401; 430/494; 101/463.1
(58) Field of Classification Search ................ 430/138, 430/281.1, 286.1, 302, 309, 348, 401, 494; 101/463.1
See application file for complete search history.

(56) References Cited

U.S. PATENT DOCUMENTS

| | | | |
|---|---|---|---|
| 6,207,349 B1 * | 3/2001 | Lewis | 430/302 |
| 2002/0092437 A1 * | 7/2002 | Lewis | 101/463.1 |
| 2005/0247226 A1 * | 11/2005 | Langlais et al. | 101/467 |
| 2006/0037505 A1 * | 2/2006 | Bieber et al. | 101/457 |

* cited by examiner

*Primary Examiner*—Barbara L. Gilliam
(74) *Attorney, Agent, or Firm*—Sughrue Mion, PLLC

(57) ABSTRACT

The present invention provides an exposure processing method of a planographic printing plate comprising: providing an image recording layer containing a polymerizable compound which is solid at the room temperature, a polymerization initiator, and a light-to-heat converting agent, and a microcapsule encapsulating at least one of the monomer and the polymerization initiator, such that the light energy quantity absorbed in the lower part of the image recording layer is more than the light energy quantity absorbed in the upper and middle parts of the image recording layer; exposing the image recording layer, and thereafter post-heating the image recording layer at a temperature in a range equal to or above the melting point of the monomer and below the glass transition point of the wall of the microcapsule. As a result, the printing resistance of a planographic printing plate is enhanced.

18 Claims, 10 Drawing Sheets

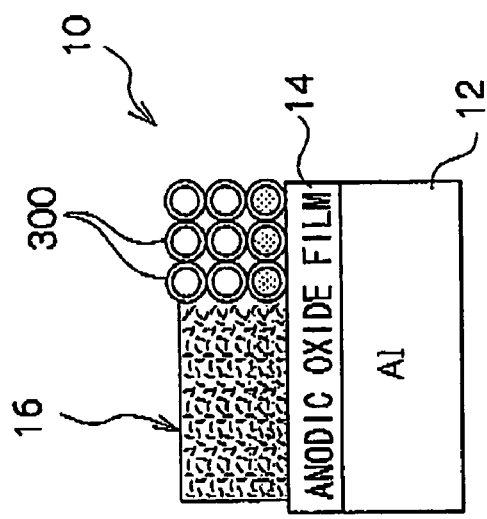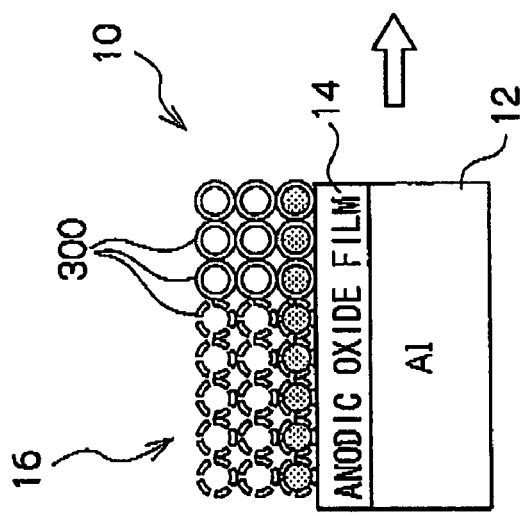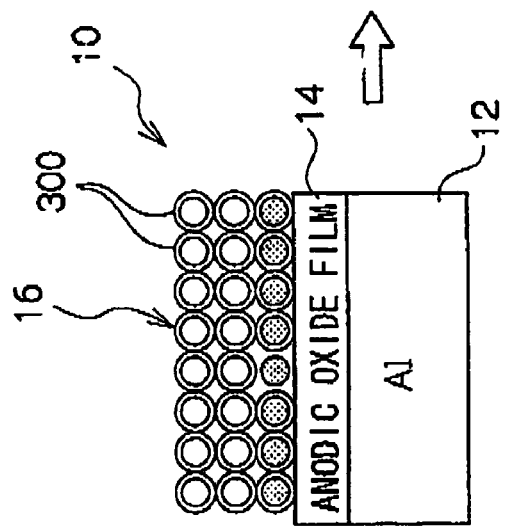

|   | UPPER LAYER | | LOWER LAYER |
|---|---|---|---|
|   | UPPER PART (THICKNESS 0.33 μM) | MIDDLE PART (THICKNESS 0.33 μM) | LOWER PART (THICKNESS 0.33 μM) |
| a | 0.239 | 0.225 | 0.386 |
| b | 0.206 | 0.169 | 0.525 |
| c | 0.139 | 0.126 | 0.635 |
| d | 0.063 | 0.063 | 0.775 |
| e | 0.550 | 0.250 | 0.100 |

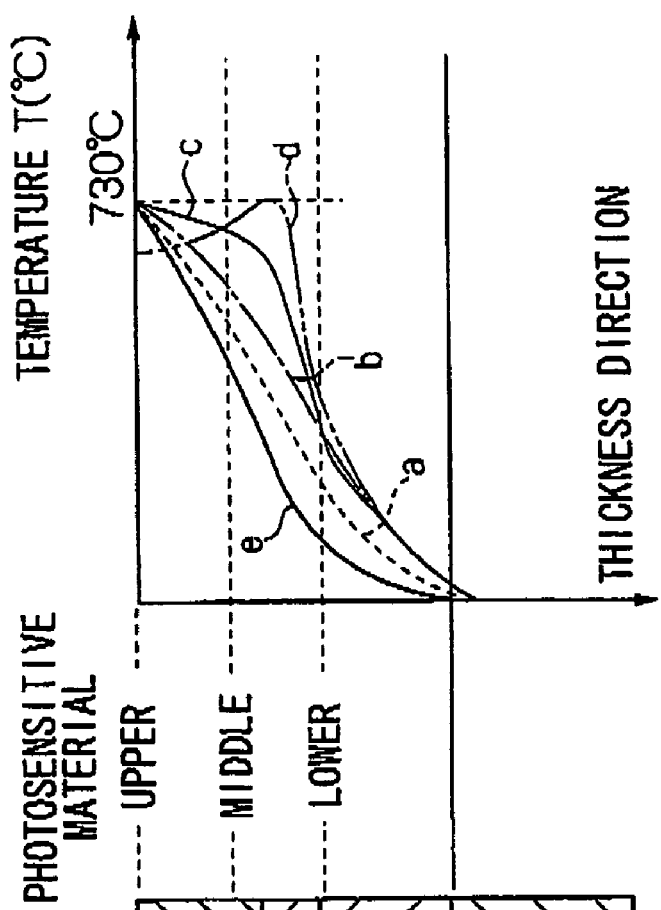
FIG.10A
FIG.10B
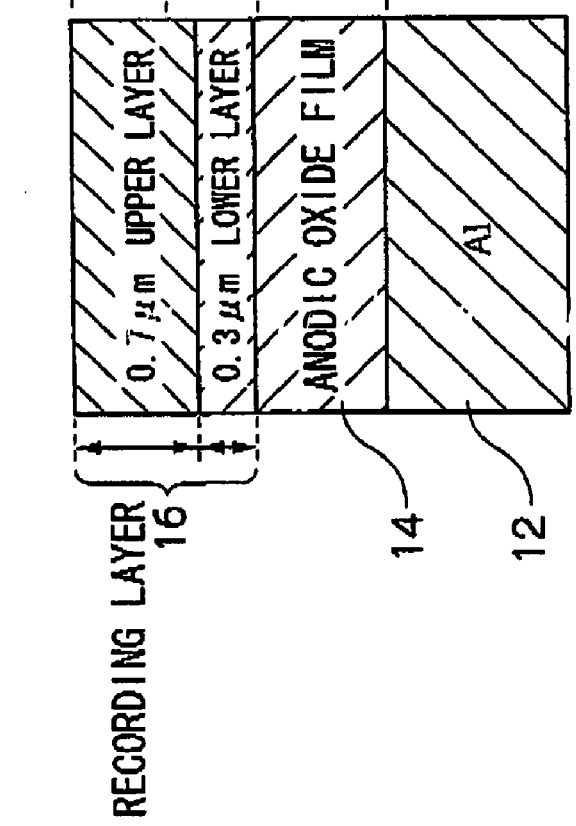

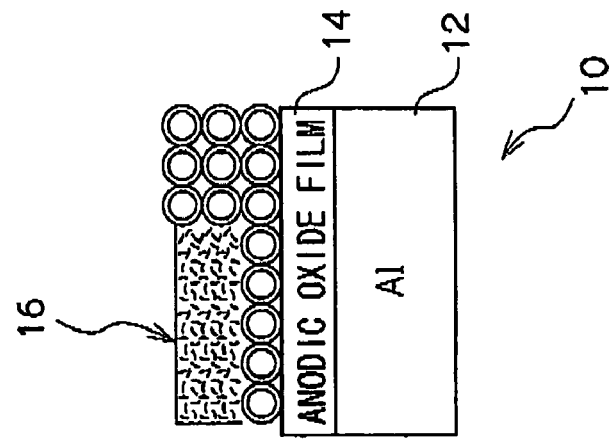
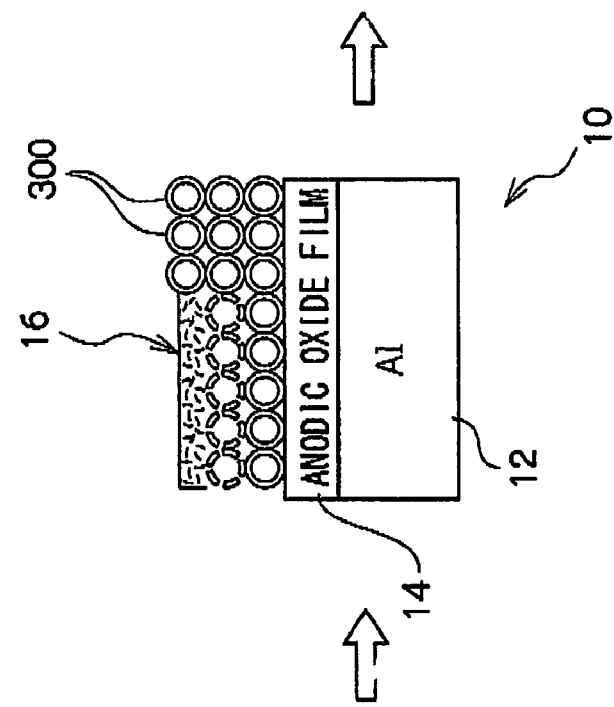
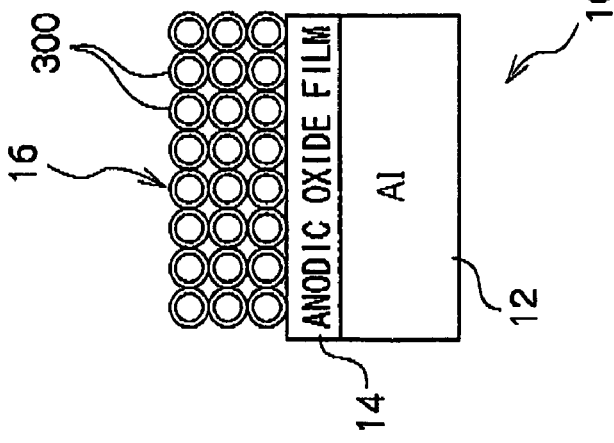

UPPER PART OF RECORDING LAYER IS SOLIDIFIED, BUT LOWER PART OF RECORDING LAYER IS NOT SOLIDIFIED.

EXPOSURE PROCESSING METHOD OF A PLANOGRAPHIC PRINTING PLATE AND APPARATUS FOR EXECUTING THE SAME METHOD

CROSS-REFERENCE TO RELATED APPLICATION

This application claims priority under 35 USC 119 from Japanese Patent Application No. 2004-096747, the disclosure of which is incorporated by reference herein.

BACKGROUND OF THE INVENTION

1. Field of the Invention

The present invention relates to an exposure processing method of a planographic printing plate of thermal recording type, which printing plate contains a compound encapsulating microcapsule in an image recording layer provided on a support body so as to be capable of being exposure processed, and an apparatus for executing the same method.

2. Description of the Related Art

For offset printing, generally, a photosensitive plate (PS plate) is used. In the field of planographic printing, a planographic printing plate has been proposed for use in computer-to-plate (CTP) systems for making printing plates directly by laser exposure processing on the basis of digital data of computer or the like.

In such CTP systems, exposing planographic printing plates and then mounting them directly on a printing press for printing, without a development process, has been proposed before. This is known as on-press development. That is, CTP systems are methods of using a recording layer (photosensitive layer) in which removing non-image portions of a printing plate precursor to form a printing plate can occur in ordinary printing process, such that development is effected on a printing press after exposing, to swiftly obtain a printing plate of a finished state, without requiring passing the plate to a specific developing process (that is, on-press development systems).

In these on-press development systems, aluminum plates having a hydrophilic surface anodized and surface roughened are used as support bodies. On this hydrophilic surface, a recording layer (photosensitive layer) is formed containing hydrophobic thermoplastic polymer particles, that can be coalesced under the effect of heat but normally dispersed in a hydrophilic binder. A compound for converting light into heat is contained in this recording layer or its adjacent layer. That is, a printing plate of thermal recording type (heat mode) is used as a planographic printing plate.

In on-press development Systems, exposure of planographic printing plates as printing plates of thermal recording type (heat mode) is executed by using, for example, laser beam (LED, light emitting diode) of a wavelength range in the infrared (IR) ray or near infrared ray regions.

In exposuring a planographic printing plate, which is a printing plate of thermal recording type (heat mode), the laser beam emitted onto the recording layer corresponding to the desired image is converted to heat. Hydrophobic thermoplastic polymer particles contained in the recording layer are heated equal to or above their solidifying temperature, to be solidified to grow hydrophobic lumps in the hydrophilic layer, and are made insoluble to ordinary water or aqueous solutions so as not to drop out and disperse.

In this on-press development system, the exposed planographic printing plate is mounted, for example, on a printing cylinder of a printing press. By stating the printing press, a dampening roller to supply aqueous dampening solution is rotated in contact with the recording layer of the planographic printing plate, and an ink roller is also rotated in contact with the recording layer of the planographic printing plate, and the printing process is carried out. As a result, solidified (cured) hydrophobic lumps are left remaining on the recording layer of the planographic printing plate, and other hydrophilic layer parts are removed by being washed off and dispersed in ordinary water or an aqueous solution, whereby the plate is developed.

Usually, after about 10 times of rotation of printing cylinder, a first clean and useable print is obtained (see, for example, the specification of Japanese Patent No. 2938397).

In a conventional planographic printing plate for on-press development (planographic printing plate which forms an image by a portion thereof being washed off and dispersed by using water or dampening water after the portion is exposed), there is a composition proposed containing a microcapsule encapsulating at least an ethylenically unsaturated compound and a polymerization initiator as active substances, in an image recording layer provided on a support body of a planographic printing plate. Active substances diffusing from the microcapsule are present on the surface of the microcapsule and near the surface.

In this case, when the image recording layer is exposed by an active beam, the film of the image recording layer is cured, and a continuous firm film is formed, and the film of the unexposed portions is washed off by water or aqueous solution (that is, the film of unexposed portion is removed by being washed off and dispensed by water or aqueous solution). (See, for example, Japanese Patent Publication No. 2639748.)

In such a conventional on-press development system, as shown in FIG. 12B and FIG. 12C, an aluminum support body 11 is used as a support body of a planographic printing plate 17 which is a printing plate of thermal recording type (heat mode). When it is exposed by a laser beam, the laser beam is emitted within a high output range so as not to cause ablation (a phenomenon of burning out the illuminated portion due to the intense energy), near and above, in the thickness direction, the layer which is the recording layer 15 of a planographic printing plate 17, but heating to sufficiently above the solidifying temperature.

In the recording layer 15 of the planographic printing place 17 as a printing plate of conventional thermal recording type (heat mode), the entire recording layer 15 is formed uniformly of a material having a specified light absorption coefficient.

Accordingly, when the planographic printing plate 17 of thermal recording type (heat mode) is exposed by laser beam, as shown in FIG. 12A, the light energy absorbed in the recording layer 15 is larger at the upside (surface) in the thickness direction of the recording layer 15 receiving the laser beam, and smaller at the downside (aluminum support body side) in thickness direction of the recording layer 15.

As a result, as shown in FIG. 12C, it is hard to heat sufficiently near the downside in thickness direction of the film in the recording layer 15. In other words, it is hard to raise the sensitivity of the planographic printing plate 17 to allow sufficient heating of the near-support portion of the film in the recording layer 15.

Further, when the sensitivity of the planographic printing plate 17 is low, the heat energy converted from the emitted laser beam near the downside in thickness direction of the film in the recording layer 15 (near the hydrophilic surface 13 of anodic oxide film) rapidly diffuses and escapes to the aluminum support body 11 side of high thermal conductivity. Hence, if emitting the laser beam at a maximum output so as not to cause ablation, the temperature is not raised sufficiently above the solidifying temperature near the interface of the hydrophilic surface 13 of the aluminum support body 11 and the recording layer 15 (heating recording layer).

Therefore, curing of the portions of the recording layer 15 illuminated with laser beam (image portions) are not promoted sufficiently, and the strength of the image portions may be insufficient.

In such a planographic printing plate of low sensitivity, when a dampening solution is applied on to the recording layer 15 for printing, since curing by the exposure process is not sufficiently progressed near the downside in the thickness direction of the layer (the interface) in the recording layer 15, portions of insufficient strength are washed off and diffuse in water or aqueous solution in the development process. As a result, as the number of prints increases, the image exposed and formed on the recording layer 15 may be easily lost and print resistance is lowered.

SUMMARY OF THE INVENTION

The present invention has been made in view of the above circumstances and provides an exposure processing method of a planographic printing plate characterized by: preparing a planographic printing plate, comprised of a support body, and an image forming recording layer provided on the support body, the image forming recording layer containing a compound-encapsulating-microcapsule and capable of being exposed; exposing the planographic printing plate to cure the exposed portion of the recording layer in the planographic printing plate from the upside in the thickness direction, and curing the exposed portion of the recording layer in the planographic printing plate up to the interface with the support body. Also provided is an apparatus for executing this method.

A first aspect of the invention is an exposure processing method of a planographic printing plate comprising the steps of: (a) providing a structure of an image recording layer containing a polymerizable compound, a compound generating a polymerization initiator, and a compound absorbing image recording light, the image recording layer having an upper part, middle part and lower part, these three parts of the image recording layer having a uniform thickness in the depth direction; (b) composing the image recording layer, with a light absorption coefficient distribution of the image recording layer in the depth direction from the surface adjusted so that the light energy quantity absorbed in the lower part of the image recording layer is more than the light energy quantity absorbed in the upper and middle parts; (c) manufacturing a planographic printing plate having a thus composed image recording layer on a support body; (d) exposing by emitting light to the image recording layer of the planographic printing plate; and (e) heating the image recording layer of the exposed planographic printing plate.

In a second aspect of the invention, the polymerizable compound is solid at the room temperature, and the heating step (e) includes heating the polymerizable compound at a temperature equal to or above its melting point.

In a third aspect of the invention, the composing step (b) includes encapsulating the polymerizable compound solid at the room temperature in a microcapsule having a glass transition point higher than the melting point of the polymerizable compound, and the heating step (e) includes setting the heating temperature below the glass transition point.

In a fourth aspect of the invention, the composing step (b) includes composing the image recording layer, with a light absorption coefficient distribution thereof being varied from the surface in the depth direction, so that the light absorption coefficient is highest in the lower part of the image recording layer positioned near the interface with the support body.

In a fifth aspect of the invention, the image recording layer contains at least a monomer which is solid at the room temperature, a compound generating a polymerization initiator, and a compound absorbing image recording light, and the heating step (e) includes heating the monomer at a temperature equal to or above its melting point.

According to the exposure processing method of a planographic printing plate of the first and fifth aspects, by the particular distribution of the light absorption coefficient in the composition of the image recording layer, when exposed in the exposure process, the lower layer portion of the image recording layer of the planographic printing plate absorbs more of the light energy entering from the surface of the image recording layer. Accordingly, the image recording layer is heated through from its surface to the interface with the support body, for example, such that the walls of all the microcapsules are broken.

Polymerization starts from the moment when the microcapsule walls are broken, and curing follows (for example, by starting chain polymerization of a monomer).

At this time depending on the conditions at the time of the exposure, process, if the monomer is once melted, it may be solidified again soon. In other words, before polymerization with the surrounding monomer is sufficiently complete, cooling and solidification can occur.

Accordingly, as proposed in the second, third and fifth aspects of the invention, the planographic printing plate is heated, as post-heating, at a temperature in a range of, for example, higher than the monomer melting point and lower than the glass transition point of the wall of the microcapsules.

Hence, in the image recording layer, monomer melts out, and is polymerized with surrounding monomer by the residual polymerization initiator to become polymer. That is, only the exposed portions of the image recording layer are solidified, cured toughly, and firmly adhered to the surface of the support body, so that the print resistance of the planographic printing plate may be enhanced.

In the post-heating, since the walls of microcapsules in the unexposed portions of the image recording layer are not broken by post-heating treatment, it is possible to cure only the exposed portions of the image recording layer.

A sixth aspect of the invention is an exposure processing apparatus comprising: an exposure processing unit for exposing by emitting light onto an image recording layer provided on a support of a planographic printing plate; and a post-heating unit for heating the image recording layer of the exposed planographic printing plate, wherein the image recording layer includes upper, middle and lower parts, these three parts of the image recording layer each having uniform thickness in the depth direction, the image recording layer has a light absorption coefficient distribution in the depth direction adapted so that the light energy quantity absorbed in the lower part of the image recording layer may be more than the light energy quantity absorbed in the upper part and middle part of the image recording layer.

In a seventh aspect of the invention, the image recording layer in the sixth aspect contains a polymerizable compound which is solid at the room temperature, a compound generating a polymerization initiator, and a compound absorbing image recording light, and the post-heating unit heats the polymerizable compound at a temperature equal to or above its melting point.

In an eighth aspect of the invention, the polymerizable compound which is solid at the room temperature in the sixth aspect is encapsulated in a microcapsule having a wall with a higher glass transition point than the melting temperature of the polymerizable compound, and the heating temperature in the post-heating unit is set below the glass transition point.

In the configuration of the sixth to eighth aspects, by the particular distribution of light absorption coefficient in the composition of the image recording layer, when exposed in the exposure process, the lower layer portion of the image recording layer of a planographic printing plate absorbs more of the light energy entering from the surface of the image recording layer than the upper and the middle layers.

Accordingly, the image recording layer is heated through from its surface to the interface with the support body, for example, such that the walls of all the microcapsules are broken. Polymerization (monomer chain polymerization) starts from the moment the microcapsule wall breaks, and the image recording layer is cured.

At this time, depending on the conditions at the time of the exposure process, if the monomer is once melted, it may be solidified again soon. In other words, before polymerization in the surrounding monomer is sufficiently complete, cooling and solidification can occur.

In the exposure processing apparatus of the invention, however, the planographic printing plate is heated by the post-heating unit to a temperature in a range, for example, higher than the monomer melting point and lower than the glass transition point of the microcapsule wall. As a result, in the image recording layer, monomer melts out, and is polymerized with surrounding monomer by residual polymerization initiator to become polymer. Hence, only the exposed portions in the image recording layer are solidified (the microcapsules in the unexposed portions remain undestroyed), cured toughly and firmly adhered to the surface of the support body, so that the print resistance of the planographic printing plate can be enhanced.

In short, according to the exposure processing method and the apparatus for executing this method of the invention, by exposing the planographic printing plate and curing the exposed portion of the recording layer from the upside in the thickness direction, and by post-heating process, the exposed portion of the recording layer is reliably cured to the interface side to the support body.

As a result, the exposed portion layer of the recording layer can be cured in the entire thickness direction, and the print resistance of the planographic printing plate can be enhanced.

BRIEF DESCRIPTION OF THE DRAWINGS

FIGS. 6A to 6C are schematic explanatory diagrams showing models of changes of an image recording layer in each processing step of an exposure processing method of a planographic printing plate in an embodiment of the invention.

FIGS. 10A and 10B are explanatory diagrams of a longitudinal section model of the temperature distribution when exposed by laser beam in a planographic printing plate in an embodiment of the invention.

FIGS. 11A to 11C are schematic explanatory diagrams of a model showing changes, in each processing step, of an image recording layer of a planographic printing plate in a comparative example relating to an embodiment of the invention.

DETAILED DESCRIPTION OF THE INVENTION

Figure 1:
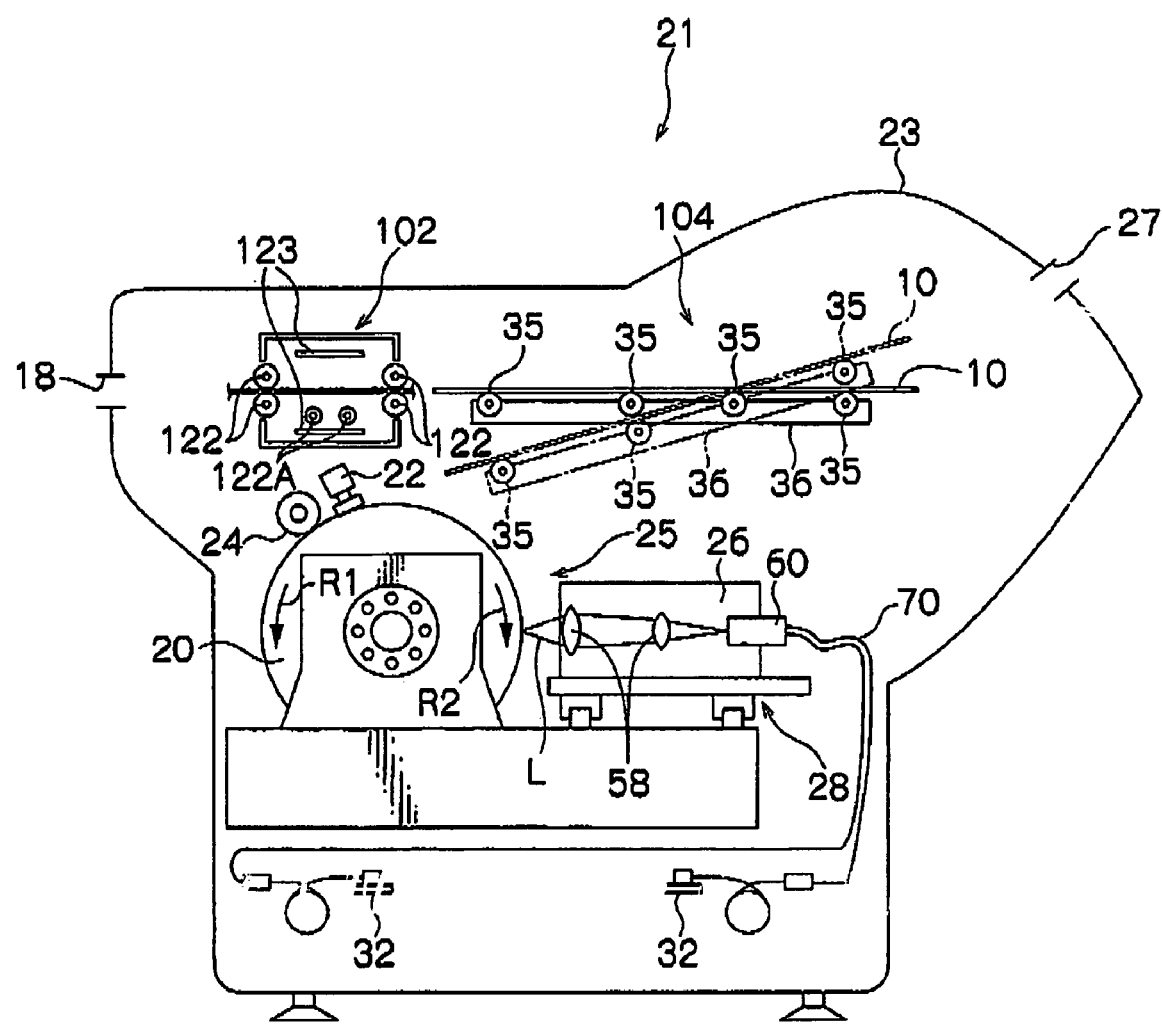
FIG. 1 is a block diagram showing a general outline configuration of image forming apparatus having a post-heating unit in a preferred embodiment of the present invention.

Referring now to the drawings, the exposure processing method of a planographic printing plate and the apparatus for executing this method in an embodiment of the invention will be described below.

(Planographic Printing Plate)

Figure 3:
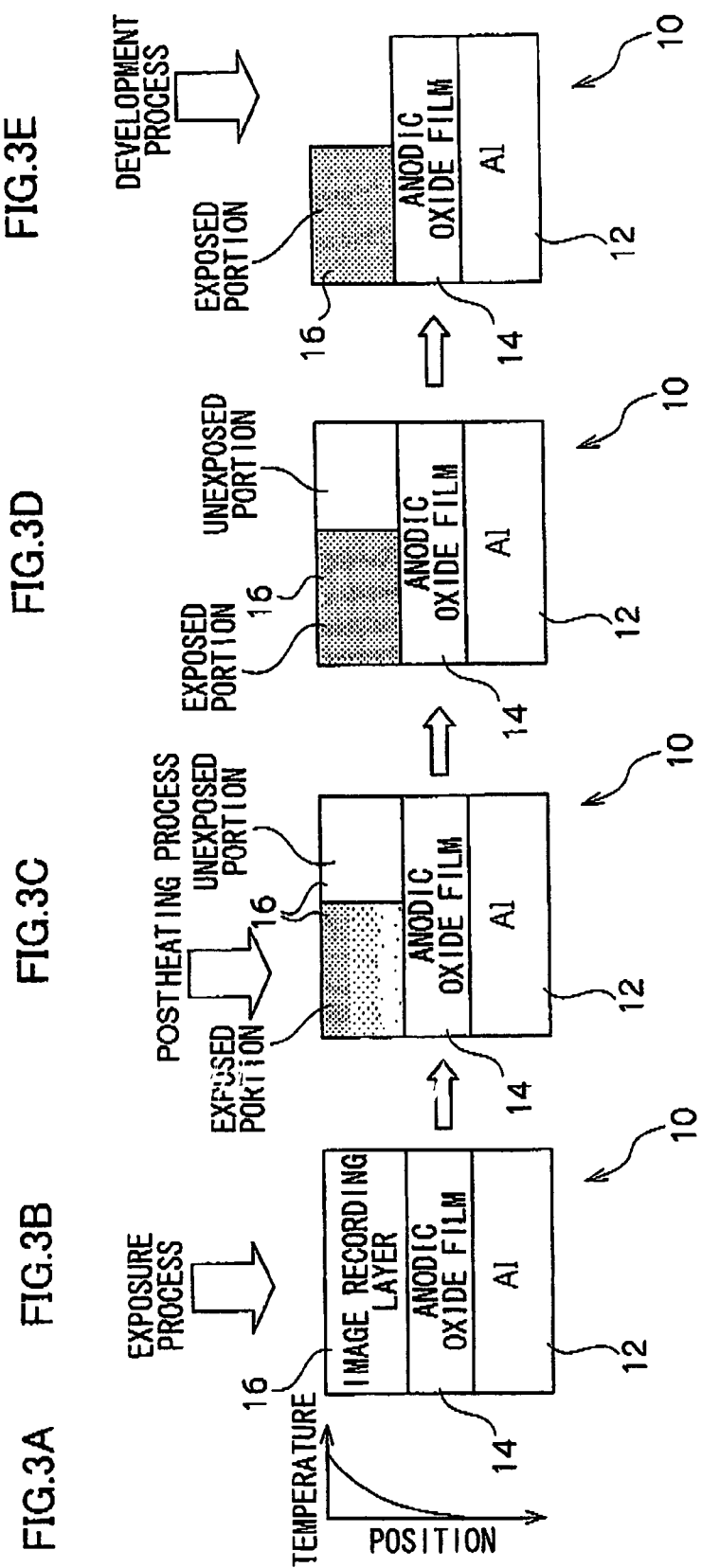
FIGS. 3A to 3E are schematic explanatory diagrams showing example processing steps of an exposure processing method of a planographic printing plate in an embodiment of the invention.

Described first is a planographic printing plate usable in the exposure processing method of a planographic printing plate and the apparatus for executing this method in an embodiment of the invention while referring to FIG. 3B.

FIG. 3B is a sectional view of a photosensitive planographic printing plate of thermal recording type.

This planographic printing plate 10 is one suitable for an on-press development system which uses a recording layer (photosensitive layer) capable of, after exposure, having the non-image portions of the printing plate precursor removed in an ordinary printing process and thus obtains a finished (developed) printing plate on the press, without using a development process.

That is, the planographic printing plate 10 comprises a support body, and an image recording layer (photosensitive layer) formed thereon the image recording layer including a compound which absorbs image recording light (photothermal converting agent) and a material which, when it receives heat, changes property so as not to peel off the support body when immersed in water. Therefore it is possible to develop the printing plate by rinsing in water or aqueous solution (water or proper aqueous solution as a developing solution). In short, water-development is possible.

This planographic printing plate 10 is a so-called noprocess plate not requiring any particular development process. The planographic printing plate 10 is structured to be of the same type as the planographic printing plate having various composition disclosed, for example, in Japanese Patent Application Laid-Open (JP-A) No. 2001-277740 or JP-A No. 2001-277742, the disclosure of which is incorporated by reference herein. That is, the definition of terms of the "polymerizable compound" and "polymerization initiator", the forming method of microcapsule, and features of the cation polymerization system and radical polymerization system disclosed in these publications are applied, as they are, to the present specification. Alternatively, the planographic printing plate 10 is structured to be of the same type as the planographic printing plate of thermal recording type (heat mode) on which is formed an image recording film layer containing a hydrophobic precursor and a compound which absorbs image recording light on a support body capable of being used generally in an on-press development system.

Herein, the printing plate of thermal recording type (heat model includes a type having a hydrophilic image forming layer provided on a hydrophilic support body, which is capable of image wise exposure in heat mode, changing the solubility and dispersibility of the hydrophilic layer, and optionally being developed by removing the unexposed portion by wet process development.

The planographic printing plate 10 of the embodiment contains: an aluminum support body 12 of aluminum or aluminum alloy and an image recording layer 16 (photosensitive layer or recording layer) formed on an anodic oxide film 14 formed on the surface of the aluminum support body 12. This image recording layer 16 contains a hydrophobic precursor and a compound absorbing image recording light.

For example, the image recording layer 16 of this planographic printing plate 10 is composed by encapsulating a monomer (or polymerizable compound) and a pigment compound which absorbs image recording light (dye, pigment, or other compound capable of converting light energy into heat energy) inside microcapsules, and further containing, in surrounding the microcapsules, a dispersant for application of the microcapsule, an initiator for starting monomer polymerization (a substance producing a Lewis acid or cation species by irradiation with light) and the like.

The initiator may be a compound for generating a polymerization initiator such as a cation polymerization initiator or a photoacid generator. The compound for generating a polymerization initiator becomes a polymerization initiator when irradiated with recording light, In this image recording layer 16, the glass transition point of walls of microcapsules is 140° C. (the measuring method of glass transition point and definition of terms conform to Japanese Patent Application Publication (JP-B) No. 6-77147 the disclosure of which is incorporated by reference herein). A monomer of melting point of 53° C. is used (the monomer being solid at the room temperature).

The photoacid generator as the initiator generates acid at, for example, 150° C. or higher (that is, the acid generation starting temperature is higher than the 140° C. of glass transition point of the walls of microcapsules), and it is solid at the room temperature (in this specification, the room temperature means 25° C.). Further, the acid produced from the photoacid generator as the initiator remains in the image recording layer 16 until the start of the next heating process (for example, the acid remains for about a day).

The planographic printing plate 10 employs a monomer which is solid at the room temperature in its image recording layer 16. Thus, if the planographic printing plate 10 is slightly irradiated with light, when the operator handles the planographic printing plate 10, the printing plate is not susceptible to accidental exposure and stable.

In this image recording layer 16, both the polymerization initiator, for producing a Lewis acid or cation species by irradiation with light, such as cation polymerization initiator (photoacid generator), and the compound absorbing image recording light may be present either inside or outside the microcapsule. In other words, it suffices if the polymerization initiator and the compound absorbing image recording light are present at at least one of the interior and the exterior of the image recording layer matrix.

From the viewpoint of storage stability, it is preferable that the cation polymerization initiator is present in the image recording layer matrix.

Also from the viewpoint of sensitivity, the compound absorbing recording light is preferably added in the microcapsule. The microcapsules contained in the image recording layer 16 are microcapsules of which the outer wall is ruptured by the heat of the exposure process when forming the image, and contain a compound having a functional group which reacts under heat.

Next the compound (photothermal converting agent) absorbing image recording light, usable in this image recording layer 16, is explained.

As a photothermal converting agent, for example, a substance absorbing infrared rays, in particular, near infrared rays (wavelength 700 to 1200 nm) may be used, such as various known pigments, dyes, colorants, and fine metal particles.

Preferred examples of pigments, dyes, colorants and fine metal particles are disclosed in JP-A No. 2001-301350, JP-A No. 2002-137562, "New Imaging Materials 2. Near Infrared Ray Absorbing Pigments" (Journal of Japan Printing Society, Vol. 38, pp. 35–40, 2001), the disclosures of which are incorporated by reference herein, and other publications. These pigments and fine metal particles may be used after known surface treatments, as required.

More specifically, as the dye or colorant, as disclosed in U.S. Pat. Nos. 4,756,993, and 4,973,572, JP-A No. 10-268512, JP-A No. 11-235883, JP-B No. 5-13514, JP-B No. 5-19702, JP A No. 2001-347765, etc., cyanine, polymethine, azomethine, and squaryilium dyes, pyrilium and thiopyrilium salt dyes, diothiol metal complexes, phthalocyanine dyes and others may be uses. More preferred examples are cyanine, squaryilium, pyrylium salt, and phthalocyanine dyes.

Pigments include insoluble azo pigment, azo lake pigment, condensed azo pigment, chelate azo pigment, phthalocyanine pigments, anthraquinone pigments, perilene and perinone pigments, thioindigo pigments, quinacridone pigments, dioxadine pigments, isoindolinone pigments, quinophthalone pigments, dyed lake pigments, azine pigments, nitroso pigments, natural pigments, fluorescent pigments, inorganic pigments, carbon black, and others.

As fine metal particles, fine particles of Ag, Au, Cu, Sb, Ge and Pb are preferred, and more preferably fine particles of Ag, Au and Cu are used. The photothermal converting agent used in the planographic printing plate 10 is not limited to these examples, and if a laser beam is absorbed and converted into heat by the agent, the type thereof is not particularly limited. The absorption band of such a photothermal converting agent may be expanded to include the visible region.

Further, as photothermal converting agents, infrared absorbing dyes, carbon powder, pi-electron system conductive polymer dispersants, and compounds containing metal atoms may be used, and they may be used either alone or in combinations of two or more types.

As means for raising the temperature at the interface of the image recording layer 16 and the anodic oxide film 14 more efficiently, in this image recording layer 16, the concentration of the substance for absorbing the laser beam and converting it into heat (i.e., the concentration of the photothermal converting agent) such as the pigment dye, colorant or fine metal particles, is adjusted.

That is, the concentration distribution in the thickness direction of the image recording layer 16 is set appropriately.

More specifically, the laser beam absorption coefficient in the lower layer in the thickness direction of the image recording layer 16 is set higher than the laser beam absorption coefficient of the upper layer in the thickness direction.

(Layer Composition of Recording Layer)

In this planographic printing plate 10, the composition of the image recording layer 16 is such that the light absorption coefficient distribution from the surface along the depth direction (the direction from the surface to the interface with the anodic oxide film 14) is specifically changed or varied (i.e., either substantially continuously or stepwise). For example, in the image recording layer 16 of the planographic printing plate 10, the image recording layer 16 of 1 μm in thickness is formed of plural layers different in laser beam absorption coefficient (the image recording layer 16 is subdivided into two or more layers).

As shown in FIG. 8 to FIG. 10A, the image recording layer 16 is modeled as three thin layer areas (upper, middle, and lower parts) having equal thicknesses in the depth direction.

Figure 4:
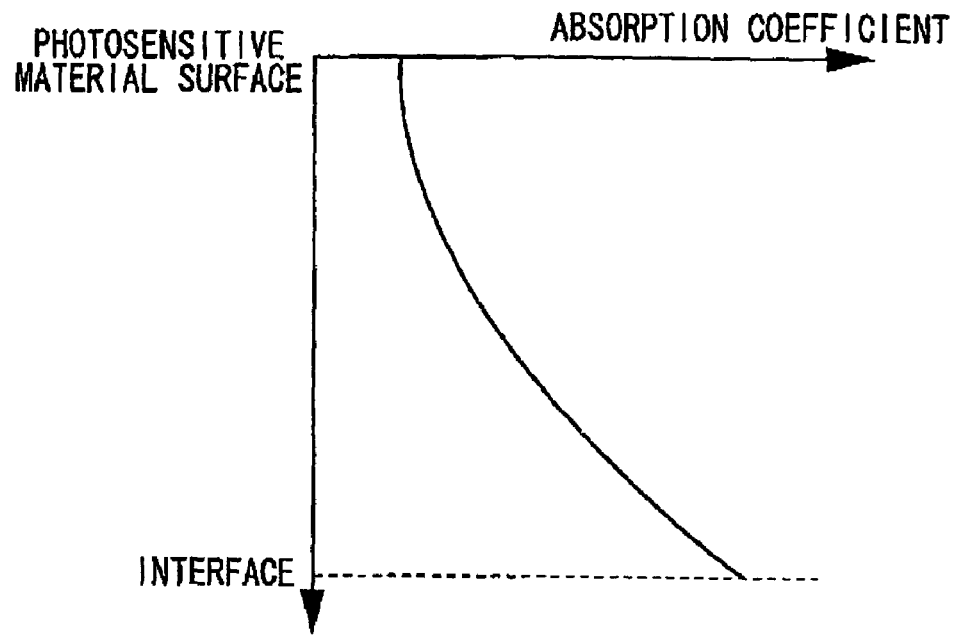
FIG. 4 is an explanatory diagram of an example of the light absorption coefficient in an image recording apparatus of a planographic printing plate (composed to vary the absorption coefficient continuously) in an embodiment of the invention.
Figure 5:
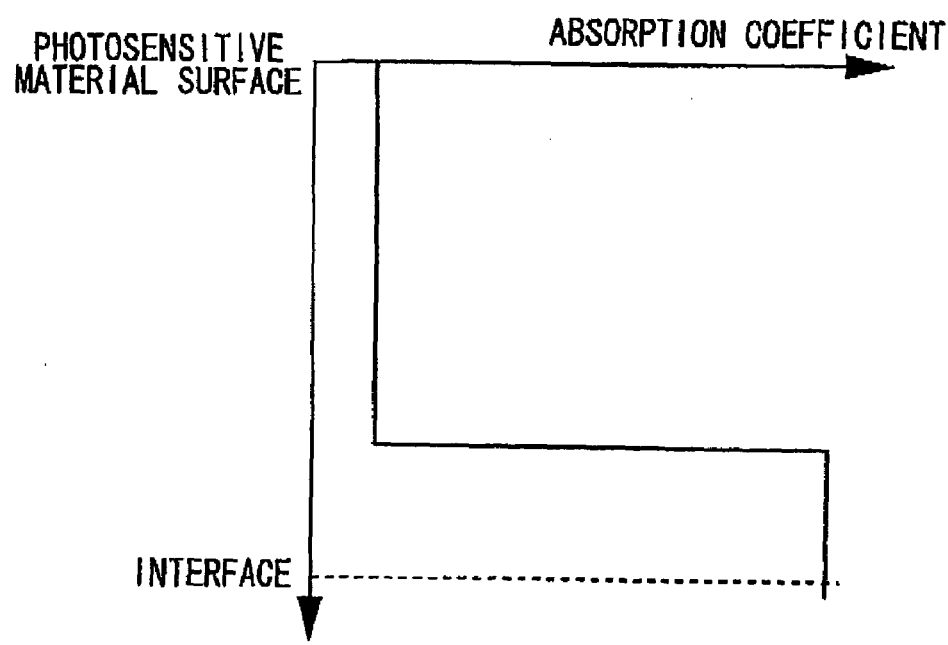
FIG. 5 is an explanatory diagram of another example of a light absorption coefficient in an image recording apparatus of a planographic printing plate (composed to vary the absorption coefficient in two steps) in an embodiment of the invention.

In order that the light energy quantity absorbed in the lower pan layer is more than the light energy quantity absorbed in the upper part and middle parts, the layers are composed with light absorption coefficient distributions which either vary continuously from the surface in the depth direction, as shown in FIG. 4 or stepwise, as shown in FIG. 5.

For example, the mixing state of the photothermal converting agent is adjusted such that the light absorption coefficient in the lower part layer in the thickness direction of the image recording layer 16 is higher than the light absorption coefficient in the upper and middle parts layer in the thickness direction of the image recording layer 16.

In a specific configuration of the image recording layer 16, the image recording layer 16 as a hydrophilic layer is composed of an upper layer and lower layer, and, of the total thickness (1 μm) of the image recording layer 16, the thickness of the upper layer (region of the upper and middle parts) is set at 0.7 μm, and the thickness of the lower layer (region of the lower part) is set at 0.3 μm. In this case, the image recording layer 16 is composed by adjusting the mixing concentration of the pigment, that is, the photothermal converting agent absorbing the light, so that the energy absorbed in the lower layer becomes greater than that absorbed in the upper layer.

In an example, the light absorption coefficient is constant within each of the upper layer (region of upper part and middle part) and the lower layer (region of lower part), and the layers are configured so that 90% of incident light becomes absorbed in the total of the upper layer and lower layer (in the entire thickness direction of the image recording layer 16). The light energy quantities to be absorbed in the region of the upper and middle parts and in the region of the lower part of the image recording region 16 can be set at the respective values a, b, c, d as shown in the table in FIG. 9.

Figures 8, 9:
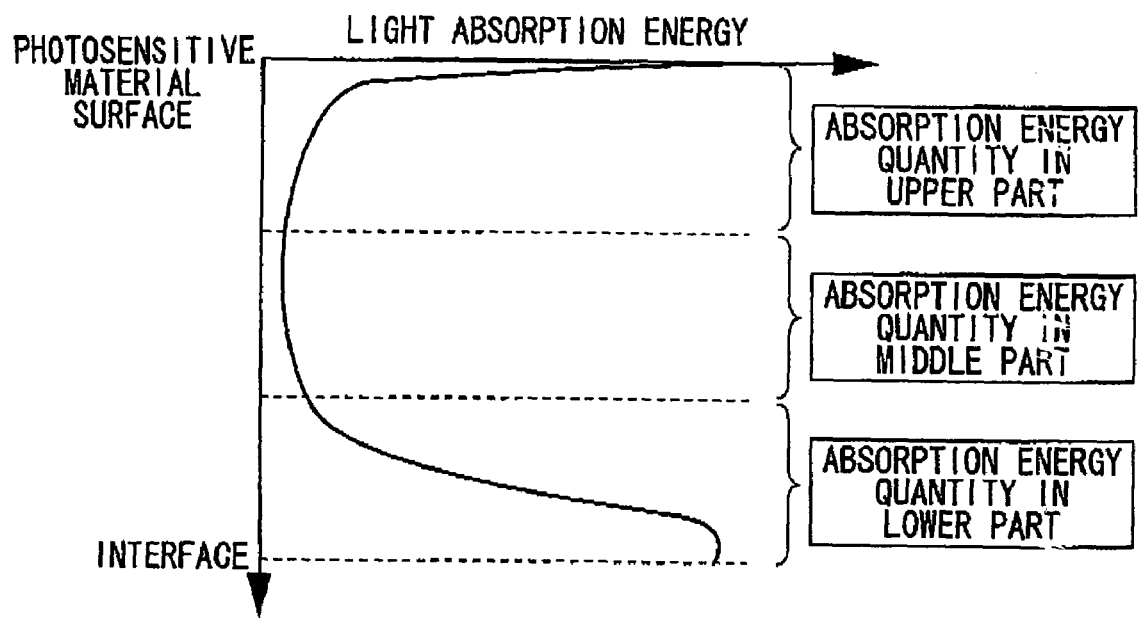
FIG. 8 is an explanatory diagram of an example of a distribution of light absorption energy when a planographic printing plate is exposed to laser beam in an embodiment of the invention.
FIG. 9 is a table showing set values of light energy quantity absorbed in the regions of the upper and middle parts and a lower part in each image recording layer of planographic printing plates in embodiments of the invention and in a comparative example.
Figure 12A:
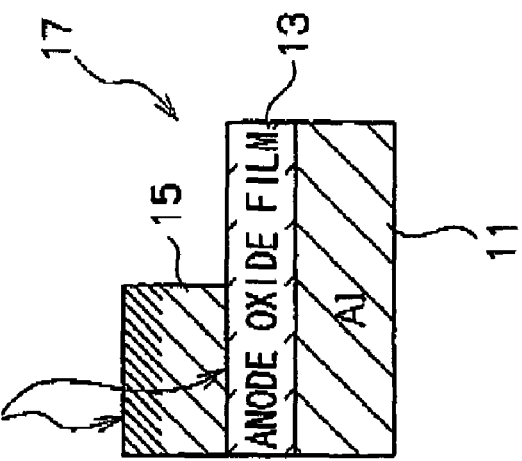
FIG. 12A is a diagram showing the temperature distribution at the time of exposure of a conventional planographic printing plate by laser beam.
Figure 12B:
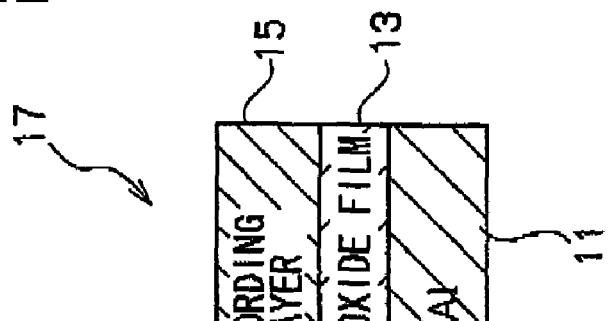
FIG. 12B is an enlarged schematic block diagram showing a longitudinal section of essential parts of a conventional planographic printing plate.
Figure 12C:
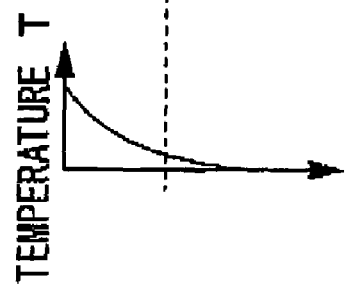
FIG. 12C is a schematic block diagram of the developed state of a conventional planographic printing plate.

As a comparative example, e in FIG. 9 is composed so that the light absorption coefficient becomes the same in both the upper layer (region of the upper and middle parts) and the lower layer (region of the lower part), that is, the entire thickness direction of the image recording layer 16 is composed to be uniform in the light absorption coefficient.

In this condition, the temperature rise can be calculated with the heat transfer coefficient of the image recording layer 16 set at 0.25 (W/m.K), which is the same as that of the heat transfer coefficient of polymer material, the heat transfer coefficient of the anodic oxide film set at 0.73 (W/m.K), and the heat transfer coefficient of aluminum set at 237 (W/m.K), and with scanning and exposing at 2.5 m/sec by light beam of 10 μm in diameter ($1/e^2$ width). Results are shown in FIG. 10B.

The results shown in FIG. 10B are expressed by standardizing the maximum temperature in the image recording layer 16 for each case to be the same (hence, the irradiation exposure quantity differs in the cases of a, b, c, d, and e).

As known from the results in FIG. 10B, comparing e, where light absorption coefficient is constant in the thickness direction of the image recording layer 16, with a, b, c, d, where light absorption coefficients are in gradient in the direction, it is apparent that the temperature is raised more in the lower part of the image recording layer 16 in a, b, c, d, where light absorption coefficients are in gradient in the thickness direction of the image recording layer 16.

Therefore, in order to obtain a temperature rise necessary for recording the lower part of the image recording layer 16, the layer composition is to be designed with a light absorption coefficient distribution where light absorption coefficients are varied in the thickness direction of the image recording layer 16 by, for example, adjusting the mixing state of the photothermal converting agent.

In a thus designed planographic printing plate 10, when the image recording layer 16 is exposed by laser beam, the temperature is sufficiently raised near the interface of the anodic oxide film 14 in the image recording layer 16, and a more appropriate exposure process is realized.

In this image recording layer 16, as shown in FIG. 5, the image recording layer 16 can be subdivided into two or more layers, and a layer of highest absorption coefficient may be provided near the interface with the anodic oxide film 14 in the image recording layer 16, such that light absorption coefficients of the image recording layer 16 are varied in the thickness direction thereof.

In the example in FIG. 5, the pigment concentration is set higher in the lower layer, corresponding to the lower ⅓ of the image recording layer 16, and the pigment concentration is set lower in the upper ⅔ of the image recording layer 16.

In the composition of the image recording layer 16 in FIG. 4, as in the composition shown in FIG. 5, the layer composition is designed with a light absorption coefficient distribution where light absorption coefficients are varied (in gradient) in the thickness direction of the image recording layer 16 in order to obtain a necessary temperature rise for recording in the lower part of the image recording layer 16. As a result, when this image recording layer 16 is exposed by laser beam, the temperature is sufficiently raised in the portion near the interface with the anodic oxide film 14 in the image recording layer 16, and an appropriate exposure process is realized.

Further, in this image recording layer 16, as shown in FIG. 8, the light absorption coefficient is set so that the light energy quantity absorbed in the lower part layer is greater than the light energy quantity absorbed in the upper part and middle part, even if the light energy quantity absorbed in the upper part surface is relatively large.

Therefore, when this image recording layer 16 is exposed by laser beam, the temperature is sufficiently raised in the portion near the interface with the anodic oxide film 14 in the image recording layer 16, so that an appropriate exposure process is realized.

EXAMPLE

An example of a photosensitive planographic printing plate of thermal recording type is explained below.

[Manufacturing Example of Support Body]

A molten metal of JIS A 1050 alloy containing 99.5 mass % or more of aluminum, 0.30 mass % of Fe, 0.10 mass % of Si, 0.02 mass % of Ti, and 0.013 mass % of Cu was purified and cast. For the purifying process, the molten metal was degassed to remove hydrogen and other extraneous gases, and cleaned by a ceramic tube filter. The casting method can be the direct chill (DC) casting method.

The solidified ingot of 500 mm in thickness was scalped to 10 mm, and homogenized for 10 hours at 550° C. so as to avoid coarsening of intermetallic compounds.

After successive hot rolling at 400° C., it was annealed for 60 seconds at 500° C. in a continuous annealing furnace, cold rolled, and an aluminum rolled plate of 0.30 mm in thickness was obtained. By controlling the roughness of the rolling roll, the center line average surface roughness Ra after cold rolling was controlled to 0.2 μm. The plate was then processed by a tension leveler in order to enhance the flatness.

The surface was treated in order to obtain a support body for a planographic printing plate. First, to remove the rolling oil from the surface of aluminum plate, it was degreased for 30 seconds at 50° C. in an aqueous solution of 10 mass % sodium aluminate, neutralized for 30 seconds at 50° C. in an aqueous solution of 30 mass % sulfuric acid, and smut was removed.

Further, to enhance the adhesion of the support body and photosensitive layer, and to provide non-image portions with water retention ability, the surface of the support body was roughened by surface roughening. An aqueous solution containing 1 mass % of nitric acid and 0.5 mass % of aluminum nitrate was kept at 45° C., and, while passing the aluminum web through the aqueous solution, electrolytic surface roughening was carried out by applying an anode side electric quantity of 240 C/dm$^2$ with an alternating waveform at a current density of 20 A/dm$^2$ and duty ratio of 1:1 from an indirect current feed cell.

It was then processed by etching for 30 seconds at 50° C. in an aqueous solution of 10 mass % sodium aluminate, neutralized for 30 seconds at 50° C. in an aqueous solution of 30 mass % nitric acid, and smut was removed.

To enhance the wear resistance, chemical resistance, and water retention ability further, an oxide film was formed on the support body by anodic oxidation. Using an aqueous solution of 20 mass % of sulfuric acid at 35° C. as the electrolyte, while conveying the aluminum web in the electrolyte, a direct current of 14 A/dm$^2$ was applied from an indirect current feed cell for electrolytic processing, and an anodic oxide film of 2.5 g/m$^2$ was formed.

Afterwards, to assure the hydrophilic property of the non-image portions of printing plate, a silicate treatment was given. That is, the aluminum web was passed through an aqueous solution of 1.5 mass % of sodium silicate No. 3 at 70° C. with a contact time of 15 seconds, and was washed in water. The loading of Si was 10 mg/m$^2$. In the thus prepared support body, the center line surface roughness Ra was 0.25 μm.

[Synthesizing Example of Microcapsule A]

As the oil phase component, 6.0 g of bis(vinyloxyethyl) ether of bisphenol A, 6.0 g of adduct of trimethylol propane and xylene diisocyanate (a microcapsule wall material manufactured by Takenate D-110N of Mitsui Takeda Chemical), 3.0 g of infrared absorbing pigment (1) expressed below, and 0.1 g of Bionin A41C were dissolved in 17.7 g of ethyl acetate. As the water phase component, 37.5 g of 4 mass % aqueous solution of PVA205 (polyvinyl alcohol of Kuraray) was prepared. The oil phase component and water phase component were emulsified for 10 minutes at 12000 rpm by using a homogenizer.

Adding 24.5 g of water, the solution was cooled in water for 30 minutes, and further stirred for 3 hours at 40° C. In the obtained microcapsule disperse solution, the solid content concentration and average particle size are shown in Table 1. The average particle size in Table 1 was measured by using a LA-910 (Horiba Co., Ltd.).

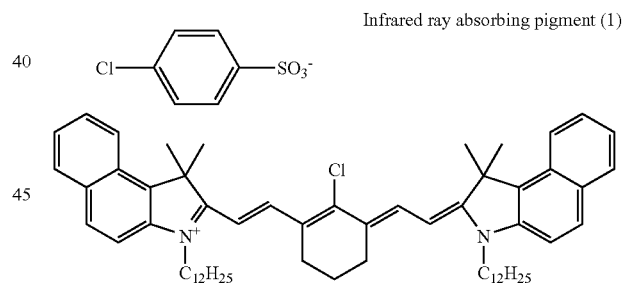

Infrared ray absorbing pigment (1)

[Synthesizing Examples of Microcapsules B to E]

Microcapsules B to E were synthesized in the same manner as microcapsule A except that the adding amounts of bis(vinyloxyethyl)ether of bisphenol A of the oil phase component and the infrared ray absorbing pigment (1) were changed as shown in Table 1.

Physical properties of microcapsules A to E

TABLE 1

| | (Bis[vinyl]oxy-ethyl)ether of bisphenol A | Infrared absorbant amount | Solid content concentration | Average particle size |
|---|---|---|---|---|
| Microcapsule A | 6.0 g | 3.0 g | 22.5% | 0.25 μm |
| Microcapsule B | 7.5 g | 1.5 g | 22.1% | 0.28 μm |
| Microcapsule C | 8.25 g | 0.75 g | 21.8% | 0.26 μm |

TABLE 1-continued

|  | (Bis[vinyl]oxy-ethyl)ether of bisphenol A | Infrared absorbant amount | Solid content concentration | Average particle size |
|---|---|---|---|---|
| Microcapsule D | 8.7 g | 0.3 g | 22.0% | 0.30 μm |
| Microcapsule E | 9.0 g | 0 g | 21.4% | 0.28 μm |

[Examples 1 to 5 and Comparative Examples 1 to 4]

On an aluminum substrate, obtained in the manufacturing example, a photosensitive layer coating solution composed of, as shown below, one of the following components selected from microcapsules A to E in the synthesizing examples was applied by bar coating, oven dried for 90 seconds at 70° C., whereby a first photosensitive layer was obtained. By repeating this operation, a planographic printing plate precursor of multilayer composition of coating weight of 1.0 g/m² was produced. The combinations of layers and coating weights of each photosensitive layer made are as shown in Table 2.

layer 16 along the depth direction (the direction from the surface to the interface with the anodic oxide film 14).

In the exposure processing method of the planographic printing plate 10, in the exposure process shown in FIG. 3B, the recording layer having the same light absorption coefficient distribution as the image recording layer 16 wherein light absorption coefficients are varied so as to be large in the vicinity of the interface with the anodic oxide film 14, is employed.

By this exposure process, the exposed portion of the image recording layer 16 is heated with a temperature profile as shown in FIG. 3A in its thickness direction.

As a result, in initial stage of exposure, it is heated from the surface of the image recording layer 16 toward the interface with the anodic oxide film 14, such that the walls of microcapsules 300 are broken as shown in FIG. 6B.

Thus, the walls of the microcapsules 300 are reliably broken near the interface with the anodic oxide film 14 because the light absorption coefficient at the interface side of the image recording layer 16 with the anodic oxide film 14 is relatively large, and the interface side portion of the

TABLE 2

|  | First photosensitive layer | | Second photosensitive layer | | Total infrared absorbing pigment amount as a % of the photosensitive layers (%) |
|---|---|---|---|---|---|
|  | Microcapsule | Coating weight (g/m²) | Microcapsule | Coating weight (g/m²) |  |
| Example 1 | Microcapsule A | 0.5 | Microcapsule E | 0.5 | 10 |
| Example 2 | Microcapsule A | 0.5 | Microcapsule D | 0.5 | 11 |
| Example 3 | Microcapsule A | 0.33 | Mlcrocapsule C | 0.67 | 10 |
| Example 4 | Microcapsule B | 0.5 | Microcapsule E | 0.5 | 5 |
| Example 5 | Microcapsule B | 0.5 | Microcapsule D | 0.5 | 6 |
| Comparative example 1 | Microcapsule B | 1.0 | — | — | 10 |
| Comparative example 2 | Microcapsule C | 1.0 | — | — | 5 |
| Comparative example 3 | Microcapsule A | 1.0 | — | — | 20 |
| Comparative example 4 | Microcapsule D | 1.0 | — | — | 2 |

Photosensitive layer solution

| | |
|---|---|
| Microcapsule obtained in synthesizing example (converted to solid content) | 9.0 g |
| Acid precursor (see acid precursor (1) below) | 0.24 g |
| Water | 35.5 g |

$$\text{Ph–I}^+\text{–Ph} \quad CF_3SO_3^-$$

Acid precursor (1)

(Exposure Processing Method of a Planographic Printing Plate)

Exposure processing method of a planographic printing plate is explained below, while referring to FIGS. 3A to 3E, FIGS. 6A to 6C, and FIGS. 7A to 7C.

In this exposure processing method of a planographic printing plate, there is employed a planographic printing plate 10, of which model is shown in FIG. 6A and of which image recording layer 16 is designed to have light absorption coefficient distribution wherein light absorption coefficients are increased from the surface of the image recording image recording layer 16 to the anodic oxide film 14 is heated sufficiently to a temperature enough to break the wall of the microcapsule 300.

Figure 7A:
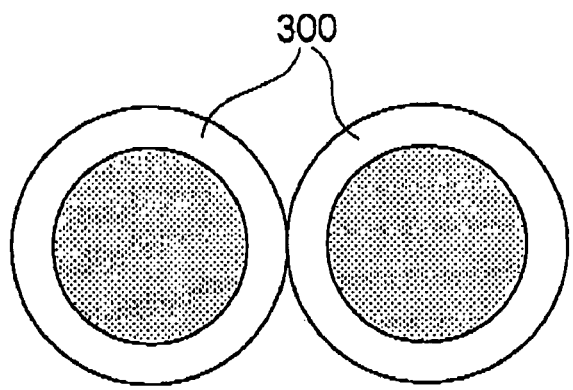
FIGS. 7A to 7C are enlarged schematic explanatory diagrams showing models of change of microcapsule portion contained in the image recording layer in each processing step of exposure processing method of a planographic printing plate in an embodiment of the invention.
Figure 7B:
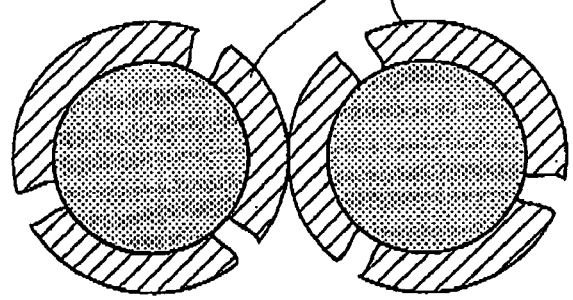

When the light absorption coefficient of the image recording layer 16 is set larger at the interface side thereof with the anodic oxide film 14 (FIGS. 7A to 7C), the walls of the microcapsules 300 can be heated to a proper temperature in the exposure process. Hence, the microcapsules 300 are broken sufficiently as shown in FIG. 7B.

In this exposure process, in the exposed portion of the image recording layer 16, the temperature exceeds 140° C.

in the initial stage of the exposure process and the wall of the microcapsules 300 are broken. Monomer contained in the image recording layer 16 melts out, and chain polymerization of melting monomer starts and curing takes place.

In the present thermal setter, since the exposure time per pixel is defined in the order of μsec, the duration of when 140° C. is exceeded is in the order of 10 μsec. Accordingly, if the monomer is exposed and once melted, it is soon solidified, and thus it may be cooled and solidified inside the broken microcapsule 300 before polymerization with the surrounding monomer is complete, as shown in FIG. 7B.

Also, outside of the broken microcapsule 300, there may be residual acid produced by the initiator (photoacid generating agent).

Thus, in the present invention, the planographic printing plate 10 exposed in this exposure process is subsequently transferred to a post-heating process, and is treated by post-heating.

This post-heating treatment is a process of heating the image recording layer 16 of the planographic printing plate 10 for a specified time, at a temperature higher than the melting point of monomer (53° C. or more in one example of the image recording layer 16) and lower than the glass transition point of walls of the microcapsules (140° C. or less in one example of the image recording layer 16).

In this post-heating process, in order to shorten the heating time, it is desired to heat for the order of tens of seconds at a temperature close to the glass transition point of walls of the microcapsules (140° C. in this image recording layer 16).

Figure 7C:
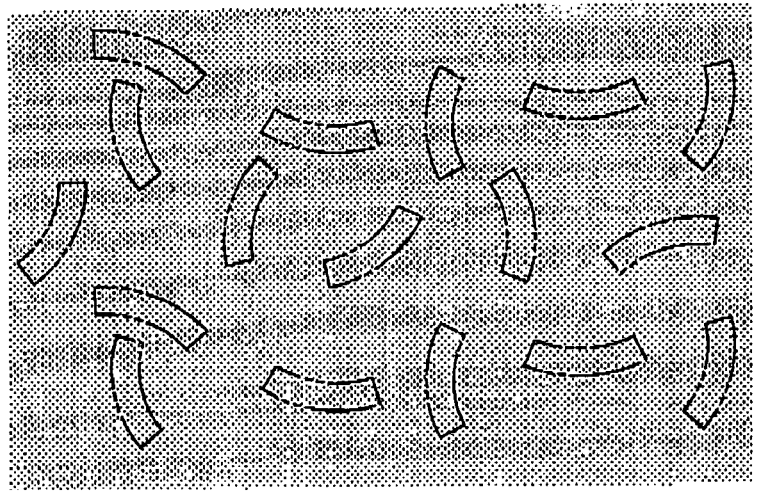

Thus, by heating the image recording layer 16 of the planographic printing plate 16 at a temperature of slightly less than 140° C., in the image recording layer 16, the monomer melts out of the broken microcapsules 300, and is polymerized with the surrounding monomer by the acid produced by the residual initiator (photoacid generating agent), and a polymer (cation polymerization type photopolymer) is produced. As a result, only the exposed portions of the image recording layer 16 are physically solidified as shown in FIG. 3D, FIG. 6C, and FIG. 7C, cured toughly and firmly adhered to the surface of the anodic oxide film 14.

After this heating process, the planographic printing plate 10 shown in FIG. 3D is developed on a printing press or developed by a developing unit. As a result, the unexposed portions of the image recording layer 16 are removed, and the planographic printing plate 10 having image portions formed thereon, printing resistance of the image portion being improved as compared with the conventional models, is obtained in a finished state, as shown in FIG. 3E.

In the exposure process of the planographic printing plate, as mentioned above, the light absorption coefficient of the image recording layer 16 is given a distribution so as to be greater near the interface with the anodic oxide film 14, so that the planographic printing plate 10 having a sufficient printing resistance is obtained.

Comparative examples are shown in FIGS. 11A to 11C.

Using a conventional planographic printing plate (a model shown in FIG. 11A) with pigment concentration being designed so that the light absorption coefficient distribution is constant in the entire thickness direction of the image recording layer 16; when it is exposed, as shown in FIG. 11B, the temperature may not rise to a sufficiently high temperature near the interface of the image recording layer 16 with the anodic oxide film 14, and the wall of the microcapsule 300 may not be broken sufficiently.

If transferred to post-heating process in such state, when the image recording layer 16 is heated for specified time at temperature higher than the melting point of monomer and lower than glass transition point of wall of microcapsule, only the surface layer of the image recording layer 16 is solidified physically, and the exposed portion of the image recording layer 16, near the interface with the anodic oxide film 14, remains unsolidified as if it had not been exposed. That is, only moderate printing resistance is obtained at the portion.

By contrast, in the exposure processing method of a planographic printing plate in an embodiment of the invention, in the exposure process as described above, basically all microcapsules 300 can be broken from the surface of the image recording layer 16 of the planographic printing plate 10 to the interface with the anodic oxide film 14. Further, by the subsequent post-heating process, the planographic printing plate 10 having sufficient printing resistance can be obtained.

(Apparatus for Executing the Exposure Processing Method of a Planographic Printing Plate)

The apparatus for executing the exposure processing method of a planographic printing plate described above will be explained below by referring to FIG. 1 and FIG. 2.

As shown in FIG. 1, an image forming apparatus 21 (setter) for executing the exposure processing method of a planographic printing plate in the aforementioned embodiment is intended to scan and expose a plate precursor of a planographic printing plate 10 by infrared ray laser (IR laser), modulated according to digital image information, and form en image (latent image) corresponding to the digital image information on the plate precursor of the planographic printing plate 10.

The image forming apparatus 21 comprises a laser recorder 25 as an exposure processing unit, and a post-heating unit 102 in the inside of a casing 23 as outer housing of the apparatus main body.

The casing 23 includes a supply port 27 for supplying the plate precursor of a planographic printing plate 10, and a discharge port 18 for discharging the planographic printing plate 10, after completion of the exposure and post-heating processes, provided at the opposite side of the supply port 27.

Further inside the casing 23, a conveying device 104 is disposed between the supply port 27, laser recorder 25, and post-heating unit 102, for delivering, discharging, transferring and delivering the planographic printing plate 10.

This conveying device 104 comprises a plurality of conveying rollers 35 and plate like guide members 36 formed disposed along the conveying route of the planographic printing plate 10. The conveying device 104 is composed rotatable, so as to be transferred between the laser recorder delivering and discharging position, for delivering and discharging the planographic printing plate 10 to and from the laser recorder 25 (as indicated by the phantom line in FIG. 1), and the post-heating unit delivering position, for delivering and discharging the planographic printing plate 10 into and from the post-heating unit 102 (as indicated by the solid line in FIG. 1).

Figure 2:
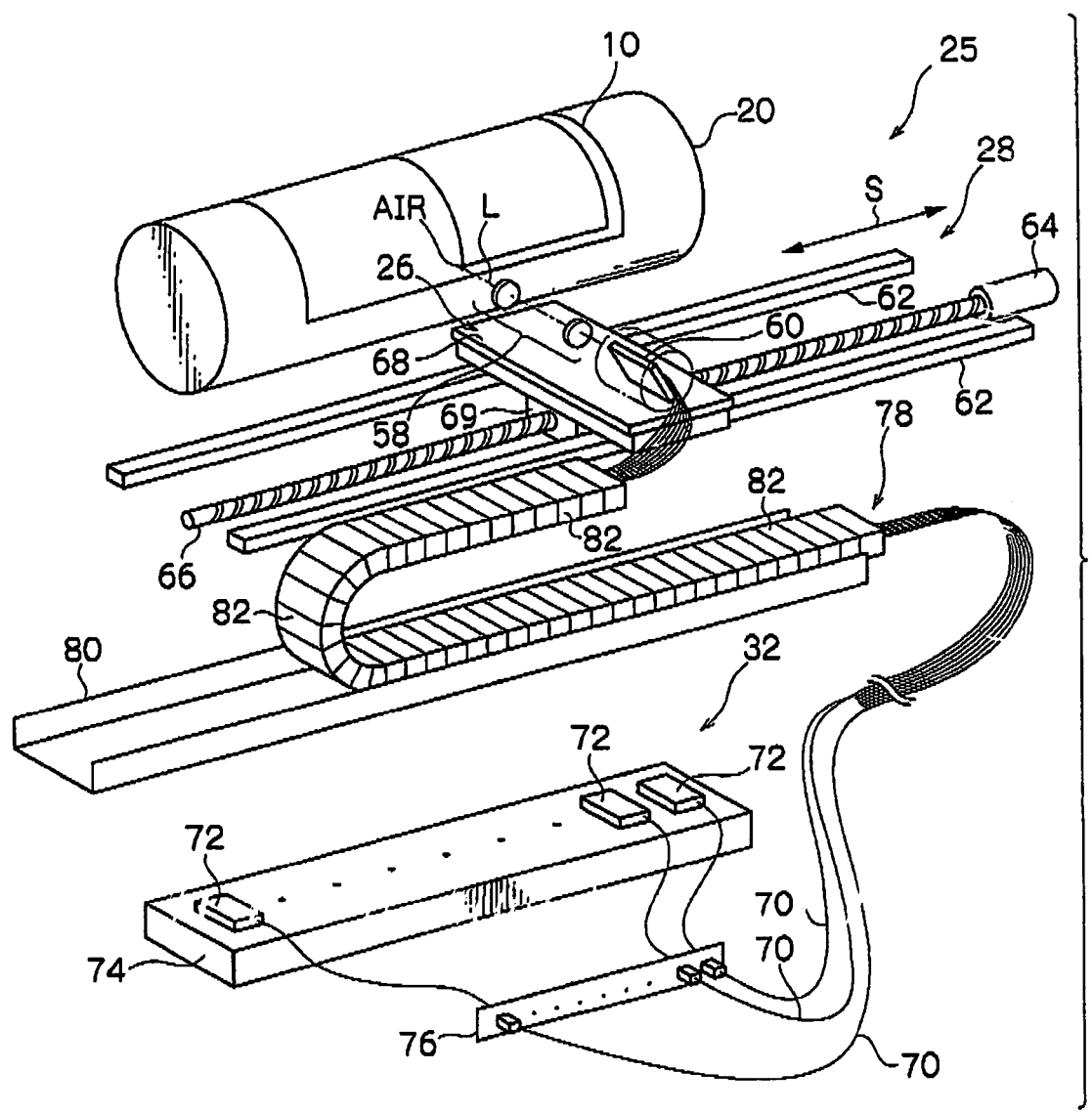
FIG. 2 is a schematic perspective view of a laser recorder taken out from the image forming apparatus in an embodiment of the invention.

As shown in FIG. 1 and FIG. 2, in the laser recorder 25, a columnar outer drum 20 for detachably mounting a planographic printing plate 10 is installed rotatably. On the outer circumference of the outer drum 20, a chuck mechanism 22 for attaching the front end and rear end of the planographic printing plate 10 onto the outer circumference of the outer drum 20 is provided (see FIG. 1), together with a guide roller 24 (shown in FIG. 1) for winding the planographic printing plate 10 onto the outer circumference of the outer drum 20.

In this laser recorder 25, an exposure head 26 is disposed opposite to the outer drum 20. The exposure head 26 is movable along the sub-scanning direction by means of feed mechanism 28.

The casing 23 incorporates LD light source devices 32, at a lower position of the outer drum 20, for supplying IR laser L to the exposure head 26.

As shown in FIG. 2, the exposure head 26 in the laser recorder 25 includes a lens unit 58 composed of plural lenses for constructing an optical imaging system, and a fiber holder 60 having a pair of support plates for holding the leading ends of plural optical fibers 70, and a transparent protective plate for protecting the leading ends of optical fibers 70.

The exposure head 26 is designed to focus the IR laser L emitted from each one of the plurality of optical fibers 70 onto the plate precursor of a planographic printing plate 10 mounted on the outer drum 20 by means of lens unit 58, thereby effecting exposure of the planographic printing plate 10 with a beam spot having specified shape and size.

This exposure head 26 is a construction with plural beam spots of a multibeam type, capable of being projected simultaneously onto the plate precursor of the planographic printing plate 10. The plural beam spots are arranged along the sub-scanning direction of the plate precursor of the planographic printing plate 10, or arranged on a straight line slightly inclined to the sub-scanning direction.

The other ends of the plural optical fibers 70 connected to the exposure head 26 are connected to plural semiconductor lasers 72 in the LD light source device 32 as shown in FIG. 2. The semiconductor lasers 72 in the LD light source device 32 are fixed onto a heat sink 74 formed like a plate.

A connector array 76 is provided in the middle of optical fibers 70, and through this connector array 76, the optical fibers 70 can be connected and disconnected at the portion of the fiber holder 60 side and the portion of the semiconductor laser 72 side, respectively.

Accordingly, for example, in the event of malfunction of any of the semiconductor laser LD, the defective semiconductor laser 72 can be easily replaced without having to dismantle the fiber holder 60 or other element.

In the plural optical fibers 70, the portion (leading end side) of the exposure head 26 side from the connector array 76 is inserted into a tubular cable conveyer 78. The cable conveyer 78 has a multiplicity of link pieces 82 divided along the longitudinal direction formed in a series linked structure, and is warpable in the vertical direction.

The cable conveyor 78 is disposed in a conveyor guide 80 of a trough shape disposed extending in the sub-scanning direction, at the lower side of a guide rail 62 of the feed mechanism 28.

The conveyor guide 80 is configured to restrict forward and aft movement of the cable conveyor 78, while supporting the cable conveyor 78 from beneath. Hence, when the exposure head 26 moves in the sub-scanning direction, the leading end portions of the optical fibers 70 moving together with the exposure head 26 are protected by the cable conveyor 78, and damage to the optical fibers 70 can be prevented.

The exposure head 26 is mounted on a carrier 68 formed like a plate in the feed mechanism 28, and moves along the sub-scanning direction (arrow S direction in FIG. 2) together with the carrier 68.

The feed mechanism 28 includes a pair of guide rails 62 supporting the carrier 68 slidable along the sub-scanning direction, and a feed screw shaft 66 linked to a motor unit 64. In the lower part of the carrier 68, a block-shaped female thread member 69 is fixed, and the screw shaft 66 is inserted into a female thread hole pierced in this female thread member 69.

In the feed mechanism 28 thus composed, by controlling the rotating of the screw shaft 66 by the motor unit 64, the exposure head 26 integral with the carrier 68 is controllably moved by the distance corresponding to the rotation amount of the screw shaft 66 in the direction corresponding to the rotating direction of the screw shaft 66 (in the forward direction or backward direction along the sub-scanning direction).

In the laser recorder 25, meanwhile, the exposure process on the planographic printing plate 10 is executed only when the exposure head 26 moves forward in the sub-scanning direction.

The laser recorder 25 having such a configuration scans and exposes the plate precursor of a planographic printing plate 10 mounted on the outer drum 20 by the IR laser L modulated according to digital image information, and forms a latent image corresponding to the digital image information on the plate precursor of this planographic printing plate 10.

In this image forming apparatus 21, the laser exposure process on the planographic printing plate 10 is followed by a post-heating process, finishing the exposure process of a planographic printing plate 10.

In the laser recorder 25 having such configuration, as shown in FIG. 1, when the plate precursor of a planographic printing plate 10 is conveyed nearly to the upper end of the outer drum 20 by the conveying device 104, the leading end of the plate precursor of a planographic printing plate 10 is chucked onto the outer circumference of the outer drum 20 by the chuck mechanism 22, and the outer drum 20 is started to rotate in the specified normal direction (arrow R1 direction in FIG. 1).

As a result, the plate precursor of a planographic printing plate 10, having the leading end fixed onto the outer circumference of the outer drum 20, is pressed and wound tightly onto the outer circumference of the outer drum 20 by the guide roller 24.

In this laser recorder 25, when the plate precursor of a planographic printing plate 10 is wound onto the outer circumference of the outer drum 20 up to the trailing end, and the rear end of the plate precursor of a planographic printing plate 10 is chucked onto the outer circumference of the outer drum 20 by the chuck mechanism 22. As a result, the entire planographic printing plate 10 is tightly wound on the outer circumference of the outer drum 20, thereby finishing the mounting action of the planographic printing plate 10 on the outer drum 20.

In the laser recorder 25, in the state where the plate of the planographic printing plate 10 is wound on the outer drum 20, while moving the exposure head 26 in the sub-scanning direction by the feed mechanism 28, the IR laser beam L emitted from the exposure head 26 is emitted onto the plate precursor of the planographic printing plate 10, and the plate precursor of the planographic printing plate 10 is exposed by sub-scanning. In the laser recorder 25, synchronizing with the completion of one sub-scanning, the outer drum 20 is rotated by a rotation amount corresponding to the main scanning pitch in the normal direction, thereby achieving normal scanning of the plate precursor of the planographic printing plate 10.

When the exposure (image forming) operation on the planographic printing plate 10 mounted on the outer drum 20 in this manner finishes, the laser recorder 25 rotates the outer drum 20 in the reverse direction (arrow R2 direction in FIG. 1), and the trailing end and leading end of the planographic printing plate 10 are sequentially released from the outer drum 20 by the chuck mechanism 22.

In conjunction with this, the conveying device 104 rotates its conveying rollers 35, and mounts the planographic printing plate 10 discharged from the outer circumference of the outer drum 20 onto the plurality of conveying rollers 35 mounted on the portion of the guide member 36.

Consequently, the conveying device 104 is moved from the laser recorder delivering and discharging position (indicated by the phantom line in FIG. 1), to the post-heating unit delivering position (indicated by solid line in FIG. 1), and delivers the planographic printing plate 10 into the post-heating unit 102.

As shown in FIG. 1, the image forming apparatus 21 has the post-heating unit 102 disposed at the upside of the outer drum 20 in the inside of the casing 23.

In the post-heating unit 102, as shown in FIG. 1, plural conveying roller pairs 122 and conveying rollers 122A are disposed at specified intervals in order to form a conveying path of the planographic printing plate 10. Further, above and beneath the conveying path of the planographic printing plate 10, heaters 123 are disposed as means for heating the recording layer of each planographic printing plate 10 to heating temperature within a specified range (equal to or above melting point of monomer and below glass transition point of wall of microcapsule).

The post-heating unit 102 is designed to heat the planographic printing plate 10 from the front and back surfaces for a specified time by heaters 123, while the planographic printing plate 10 is being conveyed on the conveying route, sufficiently to fortify the portion of the lower layer side in the thickness direction of the image forming layer (the portion of the recording layer at the back face side thereof, facing and in contact with the aluminum support body).

The heating means of the post-heating unit 102 may be composed of a heating fan unit for injecting hot air from nozzles, heat roller rolling on the planographic printing plate 10, heating means by electromagnetic irradiation, or heating means by high frequency induction heating.

The post-heating unit 102 may be also adapted to control the heating means by a heating control unit, not shown, using feedback. In this case, a temperature sensor is disposed for detecting the temperature of the heating region (the portion being heated) in the image recording layer of the planographic printing plate 10, and the temperature (surface temperature) of the heating region is detected by this temperature sensor, and a measurement signal corresponding to the surface temperature of the heating region is output to the heating control unit not shown.

The heating control unit is designed to control the heating means by feedback on the basis of the measurement signal of the temperature sensor so that the temperature of the heating region may be a specified temperature.

In such a configuration of feedback control of the heating means, the temperature of the heating region can be maintained at specified heating temperature precisely and stably.

The conditions of heating temperature and heating time in the post-heating unit 102 is determined by the characteristic of the chemical composition of the image recording layer of the planographic printing plate 10, and an appropriate heating temperature is determined by various experiments of heating at different temperatures.

The action and operation of the image forming apparatus 21 are explained below.

When forming an image on the planographic printing plate 10 by using this image forming apparatus 21, an undeveloped planographic printing plate 10 is inserted into the image forming apparatus 21 from the supply port 27 of the casing 23.

As a result, the planographic printing plate 10 is carried into the laser recorder 25 by the conveying device 104, and is chucked on the outer circumference of the outer drum 20 by the chuck mechanism 22, and thereby it is ready for exposure.

Further, the laser recorder 25 scans while emitting IR laser L onto the planographic printing plate 10 from the exposure head 26, and forms a latent image by exposure process (scanning exposure process).

Forming the latent image thereon, the planographic printing plate 10 is released from the outer drum 20 by the chuck mechanism 22, and is discharged onto the conveying device 104. As a result, the conveying device 104 discharges the planographic printing plate 10 toward the post-heating unit 102.

The post-heating unit 102 heat fortifies the lower layer portion in the thickness direction, of the exposed portions of the image recording layer on the planographic printing plate 10 (i.e., the portion of the recording layer at the back face side or the interface side thereof, in contact with the aluminum support body).

Thus, in the image forming apparatus 21 having the post-heating unit 102, the exposed planographic printing plate 10 is conveyed on the conveying path and delivered into the post-heating unit 102, wherein the portion of the lower layer side in the thickness direction, of the exposes portion of the image recording layer 16 (i.e., the portion of the recording layer at the back face side or the interface side thereof, in contact with the aluminum support body) is fortified. The exposed planographic printing plate 10 is then discharged onto a tray or the like, not shown, outside oft the apparatus from the discharge port 18.

Afterwards, the planographic printing plate 10, with latent image formed in the exposure process and post-heating process carried out in the image forming apparatus 21, is developed by a printing press or developing unit.

The exposure processing method of a planographic printing plate in the invention can be applied to various planographic printing plates and can be generally applied to planographic printing plates as printing plates of thermal recording type (heat mode), in which a film-like image recording layer containing hydrophobic precursor and photothermal converting agent has been formed on a support body usable in an on-press development system.

This printing place of thermal recording type (heat mode) includes various types, for example, a printing plate in which a hydrophilic image forming layer is provided on a hydrophilic support body, the image recording layer is subjected to image wise heat mode exposure, the solubility or dispersibility of hydrophilic layer can be optionally changed, and the unexposed portion is removed by wet development for development.

For example, the composition of printing plate of thermal recording type of the invention may be designed such that thermoplastic resin particle layer on a support body is fused by heat to be ink susceptible, and after exposure, the unexposed portion is removed by dampening with water or other aqueous solution.

More specifically, this composition can be applied to: a planographic printing plate of photothermal conversion type containing hydrophobic thermoplastic polymer particles and photothermal conversion substance, dispersed in hydrophilic binder but polymerizable under the effect of heat; a planographic printing plate of photothermal conversion type having an image forming element contained in an adjacent layer polymerizable under the effect of heat; or a planographic printing plate having a self water dispersant thermoplastic resin particle layer which can be made lipophilic by heat.

Moreover, the planographic printing plate contains, in its image forming layer, microcapsules, monomers being solid at the room temperature, wherein acid produced from a photoacid generating agent as an initiator is left over in the image recording layer until the start or next post-heating process.

What is claimed is:

1. An exposure processing method of a planographic printing plate comprising:
   (a) providing a structure of an image recording layer containing a polymerizable compound, a compound generating a polymerization initiator, and a compound absorbing image recording light, the image recording layer having an upper part, middle part and lower part, these three parts of the image recording layer having a uniform thickness in the depth direction;
   (b) manufacturing a planographic printing plate, by composing the image recording layer on a support body, with a light absorption coefficient distribution of the image recording layer in the depth direction from the surface adjusted so that the light energy quantity absorbed in the lower part of the image recording layer is more than the light energy quantity absorbed in the upper and middle parts of the image recording layer;
   (c) exposing, by emitting light onto the image recording layer of the planographic printing plate; and
   (d) heating the image recording layer of the exposed planographic printing plate.

2. The exposure processing method of a planographic printing plate of claim 1, wherein the polymerizable compound is solid at the room temperature, and the heating step (d) includes heating the polymerizable compound at a temperature equal to or above its melting point.

3. The exposure processing method of a planographic printing plate of claim 2, wherein the manufacturing step (b) includes encapsulating the polymerizable compound solid at the room temperature in a microcapsule having a glass transition point higher than the melting point of the polymerizable compound, and the heating step (d) includes setting the heating temperature below the glass transition point.

4. The exposure processing method of a planographic printing plate of claim 3, wherein the exposing step (c) includes melting the polymerizable compound, breaking the microcapsule wall, and generating a polymerization initiator in the compound for generating a polymerization initiator.

5. The exposure processing method of a planographic printing plate of claim 1, wherein the manufacturing step (b) includes composing the image recording layer, with a light absorption coefficient distribution thereof being varied from the surface in the depth direction, so that the light absorption coefficient is highest in the lower part of the image recording layer positioned near the interface with the support body.

6. The exposure processing method of a planographic printing plate of claim 5, wherein the manufacturing step (b) includes composing the image recording layer so that its light absorption coefficient increases substantially continuously from the upper part to the lower part of the image recording layer.

7. The exposure processing method of a planographic printing plate of claim 5, wherein the manufacturing step (b) includes composing the image recording layer so that its light absorption coefficient increases stepwise from the upper part to the lower part of the image recording layer.

8. The exposure processing method of a planographic printing plate of claim 5, wherein the manufacturing step (b) includes composing the image recording layer so the light absorption coefficient of the lower part of the image recording layer is highest by varying, from the surface in the depth direction, the concentration of the compound for absorbing the image recording light.

9. The exposure processing method of a planographic printing plate of claim 8, wherein the manufacturing step (b) includes setting the concentration of the compound absorbing the image recording light in the lower part of the image recording layer higher than the concentrations of the compound absorbing the image recording light in the upper part and middle part of the image recording layer.

10. The exposure processing method of a planographic printing plate of claim 1, wherein the image recording layer contains at least a monomer which is solid at the room temperature, a compound generating a polymerization initiator, and a compound absorbing image recording light, and the heating step (d) includes heating the monomer at a temperature equal to or above its melting point.

11. An exposure processing method of a planographic printing plate comprising:
    (a) providing a structure of an image recording layer containing a polymerizable compound, a compound generating a polymerization initiator, and a compound absorbing image recording light, the image recording layer having an upper part, middle part and lower part, these three parts of the imager recording layer each having a uniform thickness in the depth direction;
    (b) manufacturing a planographic printing plate by composing an image recording layer on a support body so that the concentration of the compound absorbing the image recording light varyies from the surface in the depth direction so that the light energy quantity absorbed in the lower layer of the image recording layer is more than the light energy quantity absorbed in the upper and middle parts of the image recording layer;
    (c) exposing by emitting light to the image recording layer of the planographic printing plate; and
    (d) heating the image recording layer of the exposed planographic printing plate.

12. The exposure processing method of a planographic printing plate of claim 11, wherein the manufacturing step (b) includes encapsulating the polymerizable compound and the compound absorbing the image recording layer in a microcapsule having a glass transition point higher than the melting point of the polymerizable compound.

13. The exposure processing method of a planographic printing plate of claim 12, wherein the polymerizable compound is solid at the room temperature, and the heating step (d) includes heating the polymerizable compound at a temperature equal to or above its melting point.

14. The exposure processing method of a planographic printing plate of claim 13, wherein the heating step (d) includes setting the heating temperature below the glass transition point of the microcapsule wall.

15. The exposure processing method of a planographic printing plate of claim 11, wherein the exposing step (c) includes melting the polymerizable compound, breaking the microcapsule wall, and generating a polymerization initiator in the compound for generating a polymerization initiator.

16. The exposure processing method of a planographic printing plate of claim 11, wherein the manufacturing step (b) includes forming the image recording layer such that the image recording layer contains at least a monomer which is solid at the room temperature, a compound generating a polymerization initiator, and a compound absorbing the image recording light, and the heating step (d) includes heating the monomer at a temperature equal to or above its melting point.

17. The exposure processing method of a planographic printing plate of claim 11, wherein manufacturing step (b) includes composing the image recording layer so that its light absorption coefficient increases substantially continuously from the upper part to the lower part of the image recording layer.

18. The exposure processing method of a planographic printing plate of claim 11, wherein the manufacturing step (b) includes composing the image recording layer so that its light absorption coefficient increases in steps from the upper part to the lower part of the image recording layer.

* * * * *

UNITED STATES PATENT AND TRADEMARK OFFICE
CERTIFICATE OF CORRECTION

PATENT NO. : 7,175,971 B2
APPLICATION NO. : 11/091340
DATED : February 13, 2007
INVENTOR(S) : Ichirou Miyagawa et al.

It is certified that error appears in the above-identified patent and that said Letters Patent is hereby corrected as shown below:

Please amend claim 11 as follows:

11. An exposure processing method of a planographic printing plate comprising:
    (a) providing a structure of an image recording layer containing a polymerizable compound, a compound generating a polymerization initiator, and a compound absorbing image recording light, the image recording layer having an upper part, middle part and lower part, these three parts of the ~~imager~~ image recording layer each having a uniform thickness in the depth direction;
    (b) manufacturing a planographic printing plate by composing an image recording layer on a support body so that the concentration of the compound absorbing the image recording light ~~varyies~~ varies from the surface in the depth direction so that the light energy quantity absorbed in the lower layer of the image recording layer is more than the light energy quantity absorbed in the lower layer of the image recording layer is more than the light energy quantity absorbed in the upper and middle parts of the image recording layer;
    (c) exposing by emitting light to the image recording layer of the planographic printing plate; and
    (d) heating the image recording layer of the exposed planographic printing plate.

Signed and Sealed this

First Day of May, 2007

JON W. DUDAS
*Director of the United States Patent and Trademark Office*